(12) United States Patent
Malinowski et al.

(10) Patent No.: US 9,812,573 B1
(45) Date of Patent: Nov. 7, 2017

(54) SEMICONDUCTOR STRUCTURE INCLUDING A TRANSISTOR HAVING STRESS CREATING REGIONS AND METHOD FOR THE FORMATION THEREOF

(71) Applicant: GLOBALFOUNDRIES Inc., Grand Cayman (KY)

(72) Inventors: Arkadiusz Malinowski, Dresden (DE); Chung Foong Tan, Dresden (DE); Nicolas Sassiat, Dresden (DE); Maciej Wiatr, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/153,831

(22) Filed: May 13, 2016

(51) Int. Cl.
| | | |
|---|---|---|
| *H01L 29/78* | (2006.01) | |
| *H01L 21/306* | (2006.01) | |
| *H01L 29/66* | (2006.01) | |
| *H01L 29/08* | (2006.01) | |
| *H01L 21/3065* | (2006.01) | |
| *H01L 21/02* | (2006.01) | |
| *H01L 29/165* | (2006.01) | |
| *H01L 21/8234* | (2006.01) | |
| *H01L 27/088* | (2006.01) | |

(52) U.S. Cl.
CPC .... *H01L 29/7848* (2013.01); *H01L 21/02381* (2013.01); *H01L 21/02433* (2013.01); *H01L 21/02532* (2013.01); *H01L 21/3065* (2013.01); *H01L 21/30604* (2013.01); *H01L 21/823425* (2013.01); *H01L 27/088* (2013.01); *H01L 29/0847* (2013.01); *H01L 29/165* (2013.01); *H01L 29/66636* (2013.01)

(58) Field of Classification Search
None
See application file for complete search history.

(56) References Cited

U.S. PATENT DOCUMENTS

| | | | | |
|---|---|---|---|---|
| 2004/0173575 | A1* | 9/2004 | Kumar | B81C 1/00952 |
| | | | | 216/86 |
| 2011/0220964 | A1* | 9/2011 | Shin | H01L 21/30608 |
| | | | | 257/183 |
| 2014/0361339 | A1* | 12/2014 | Liu | H01L 29/7848 |
| | | | | 257/192 |

OTHER PUBLICATIONS

Malinowski, "Study of Radical Kinetic Behavior Investigation Technique and its Application in Ultimate CMOS TCAD Topography Simulation," Nagoya University, 2012.

* cited by examiner

*Primary Examiner* — Michelle Mandala
(74) *Attorney, Agent, or Firm* — Amerson Law Firm, PLLC

(57) ABSTRACT

A method includes providing a semiconductor structure including a substrate, a gate structure over the substrate and a sidewall spacer adjacent the gate structure. The substrate includes a first semiconductor material. A substantially isotropic first etch process removing the first semiconductor material is performed. The first etch process forms an undercut below the sidewall spacer. An anisotropic second etch process removing the first semiconductor material is performed, wherein an etch rate in a thickness direction of the substrate is greater than an etch rate in a horizontal direction that is perpendicular to the thickness direction. A crystallographic third etch process removing the first semiconductor material is performed, wherein an etch rate in a first crystal direction is greater than an etch rate in a second crystal direction. The first, second and third etch processes form a source-side recess and a drain-side recess adjacent the gate structure.

20 Claims, 6 Drawing Sheets

SEMICONDUCTOR STRUCTURE INCLUDING A TRANSISTOR HAVING STRESS CREATING REGIONS AND METHOD FOR THE FORMATION THEREOF

BACKGROUND

1. Field of the Disclosure

Generally, the present disclosure relates to integrated circuits and methods for the formation thereof, and, in particular, to integrated circuits including field effect transistors having stress creating regions and methods for the formation thereof.

2. Description of the Related Art

Integrated circuits include a large number of circuit elements which include, in particular, field effect transistors. In a field effect transistor, a gate structure including a gate electrode and a gate insulation layer may be provided, wherein the gate insulation layer separates the gate electrode from a channel region and provides an electrical insulation between the gate electrode and the channel region. Adjacent the channel region, a source region and a drain region may be provided. The source region, the drain region and the channel region may be provided in a semiconductor material, wherein the source region and the drain region are doped differently than the channel region. In P-channel transistors, the source and drain regions may be P-doped, and the channel region may be N-doped or substantially undoped. In N-channel transistors, the source region and the drain region may be N-doped, and the channel region may be P-doped or substantially undoped.

Depending on a gate voltage that is applied between the gate electrode and the source region, a field effect transistor can be switched between an ON-state, wherein there is a relatively high electrical conductance between the source region and the drain region, and an OFF-state, wherein there is a relatively low electrical conductance between the source region and the drain region. The conductance of the channel region in the ON-state of the field effect transistor may depend on the dopant concentration in the channel region, the mobility of charge carriers in the channel region, the extension of the channel region in the width direction of the transistor and on the distance between the source region and the drain region, which is commonly denoted as "channel length."

For increasing the conductance of the channel region in the ON-state of the transistor, it has been proposed to improve the mobility of charge carriers in the channel region by modifying the lattice structure of the semiconductor material wherein the channel region is formed. This may be done by creating a tensile or compressive stress in the channel region. A compressive stress in the channel region can increase the mobility of holes, leading to an increase of the conductivity of the channel region of P-type transistors. Conversely, a tensile stress in the channel region can increase the mobility of electrons, which can improve the conductivity of the channel region of N-type transistors.

For creating a compressive stress in the channel region of a P-channel transistor having a channel region that is provided in a silicon semiconductor material, stress creating regions including silicon germanium may be formed adjacent the channel region of the transistor. For forming the stress creating regions, recesses may be formed in the substrate adjacent the channel region, and the recesses may be filled with silicon germanium. Silicon germanium has a greater crystal lattice constant than substantially pure silicon. When silicon germanium is deposited on substantially pure silicon, the differences in the crystal lattice constants between silicon germanium and silicon can create a compressive stress.

In some examples of P-channel transistors including silicon germanium stress creating regions, a so-called sigma shape of the interface between the stress creating regions and the channel regions may be provided, wherein the interface includes an upper portion that is inclined inwardly relative to the channel region, and a lower portion that is inclined outwardly relative to the channel region, similar to the shape of the Greek letter "Σ" For obtaining the sigma shape of the interface between the silicon germanium and the silicon, U-shaped recesses may be formed adjacent the gate structure of the transistor by means of a reactive ion etch process. Thereafter, a crystallographic wet etch process, for example, a wet etch process wherein an etchant including tetramethylammoniumhydroxide (TMAH) is used, may be performed. The crystallographic wet etch process may have a substantially greater etch rate in the <100> crystal direction of silicon than in the <111> crystal direction. Therefore, in the wet etch process, surfaces being normal to <111> directions can be obtained, which may provide inwardly inclined upper and outwardly inclined lower portions of sidewalls of the recesses, which can provide the sigma shape of the stress creating regions when the recesses are filled with silicon germanium.

The compressive stress obtained in the channel region of the transistor can depend on a distance of a tip between the upper and lower portions of the interface between the stress creating regions and the channel region from the gate insulation layer and on a tip-to-tip distance between the tip of the stress creating region at the source-side of the gate structure and the tip of the stress creating region at the drain-side of the gate structure.

In some applications of stress creating regions as described above, it may be desirable to obtain a greater stress in the channel regions of transistors.

The present disclosure provides semiconductor structures including transistors having a relatively high stress in their channel regions and methods for the formation thereof.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes providing a semiconductor structure. The semiconductor structure includes a substrate, a gate structure over the substrate and a sidewall spacer adjacent the gate structure. The substrate includes a first semiconductor material. A substantially isotropic first etch process removing the first semiconductor material is performed. The first etch process forms an undercut below the sidewall spacer. An anisotropic second etch process removing the first semiconductor material is performed. In the second etch process, an etch rate in a thickness direction of the substrate is greater than an etch rate in a horizontal direction that is perpendicular to the thickness direction. A crystallographic third etch process removing the first semiconductor material is performed. In the third etch process, an etch rate in a first crystal direction is greater than an etch rate in a second crystal direction. The first, second and third etch processes form a source-side recess and a drain-side recess adjacent the gate structure.

An illustrative semiconductor structure disclosed herein includes a transistor. The transistor includes a channel region including a first semiconductor material, a source-side stress creating region including a second semiconductor material having a different lattice constant than the first semiconductor material and a drain-side stress creating region including the second semiconductor material. Each of an interface between the source-side stress creating region and the channel region and an interface between the drain-side stress creating region and the channel region includes a first portion, a second portion, a third portion and a fourth portion. The first portion is inclined inwardly with respect to the channel region. The second portion is below the first portion and is inclined outwardly with respect to the channel region. The third portion is below the second portion and is inclined inwardly with respect to the channel region. The fourth portion is below the third portion and is inclined outwardly with respect to the channel region.

BRIEF DESCRIPTION OF THE DRAWINGS

The disclosure may be understood by reference to the following description taken in conjunction with the accompanying drawings, in which like reference numerals identify like elements, and in which.

Figure 1:
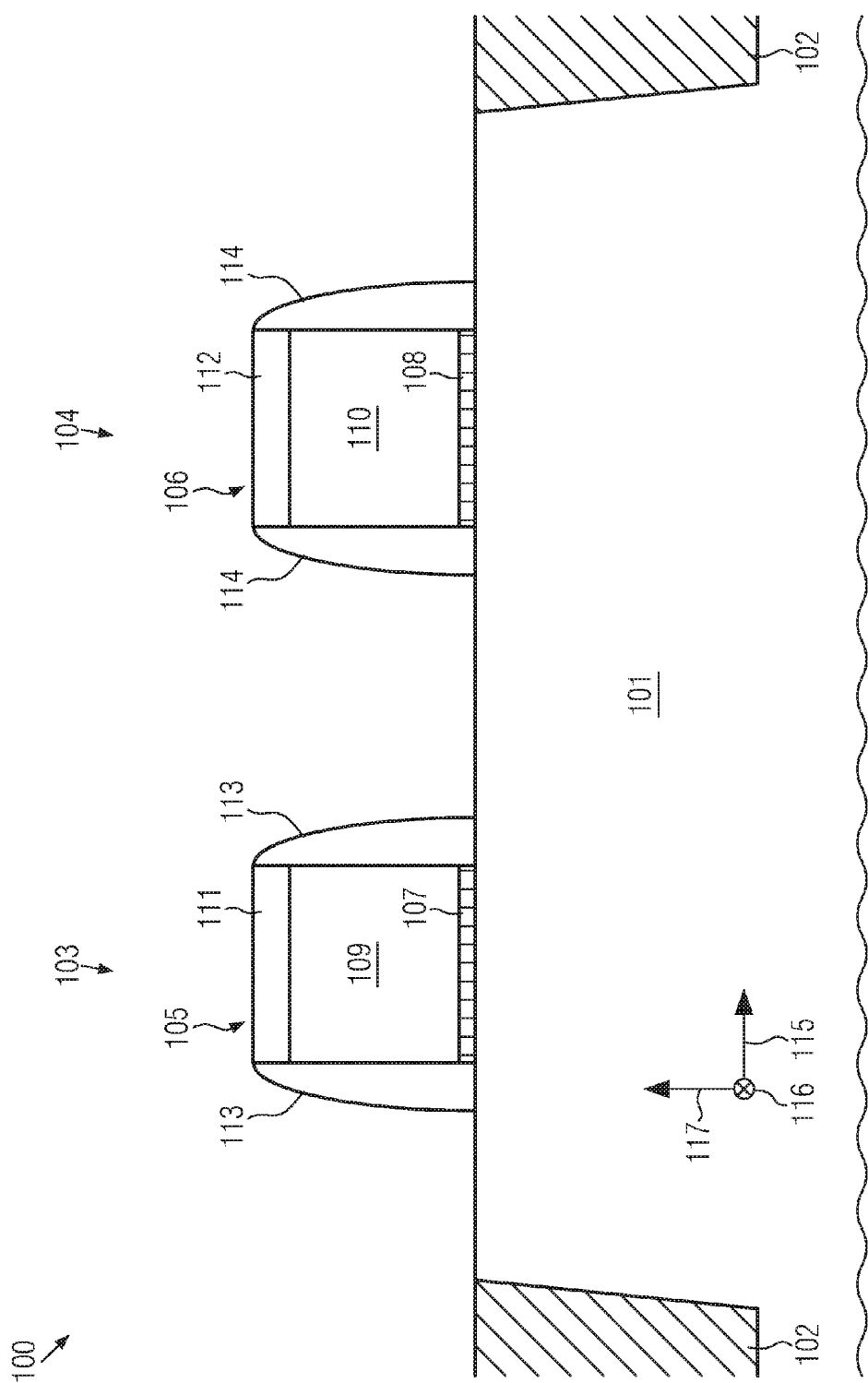
FIGS. 1-5 show schematic cross-sectional views of a semiconductor structure according to an embodiment in stages of a method according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

In embodiments disclosed herein, modified sigma-shaped recesses may be formed adjacent gate structures of field effect transistors, in particular P-channel transistors, which may be filled with a material having a different lattice constant than the semiconductor material of the substrate for forming stress creating regions. The substrate may be a silicon substrate, and the recesses may be filled with silicon germanium. Each interface between a stress creating region and the channel region of the transistor may have two tips between differently inclined portions of the interface, wherein one of the tips is relatively close to the gate insulation layer of the gate structure of the transistor, which can help to obtain a greater stress in portions of the channel region of the transistor wherein the electrically conductive channel is formed in the ON-state of the transistor. For obtaining the modified sigma shape of recesses, a combination of a substantially isotropical dry plasma radical etch process and an anisotropic dry plasma reactive ion etch process may be performed. In the isotropic etch process, undercuts may be formed below sidewall spacers adjacent gate structures of field effect transistors. In the anisotropic etch process, the semiconductor material of the substrate may be removed from U-shaped regions adjacent the gate structures. Thereafter, a crystallographic etch process, for example a wet etch process wherein tetramethylammoniumhydroxide (TMAH) is used, may be performed, wherein the modified sigma shape may be obtained. Then, a semiconductor material having a different lattice constant than the semiconductor material of the substrate may be deposited for forming the stress creating regions.

The isotropic etching wherein the undercuts below the sidewall spacers are formed may be performed by turning off a bias voltage in the initial phase of a dry plasma etch process so that a substantially isotropical etching by radicals is obtained, wherein the etch rate is approximately the same in any direction. After a few seconds, the bias voltage may be turned on so that ions from the plasma are accelerated towards the semiconductor structure, and an anisotropic etching wherein the semiconductor material of the substrate is removed from U-shaped regions adjacent the gate structures and the sidewall spacers is obtained. The substantially isotropic etching by radicals obtained at the beginning of the plasma etch in the absence of the bias voltage may have a relatively small etch rate so that the size of the undercuts below the sidewall spacers may be relatively precisely controlled by adjusting the time of the substantially isotropic etching, and a relatively high uniformity of the sizes of the undercuts across the semiconductor structure may be obtained.

FIG. 1 shows a schematic cross-sectional view of a semiconductor structure 100 according to an embodiment in a stage of a method according to an embodiment. The semiconductor structure 100 includes a substrate 101. In some embodiments, the substrate 101 may be a bulk semiconductor substrate, for example, a silicon wafer. In other embodiments, the substrate 101 may be a semiconductor-on-insulator (SOI) substrate including a layer of a semiconductor material, for example a silicon layer, that is provided above a support substrate, which may be a silicon wafer, and separated from the support substrate by a layer of an electrically insulating material such as, for example, silicon dioxide.

The substrate 101 may have a disc shape having a thickness direction, wherein an extension of the substrate 101 in the thickness direction is smaller than any extension of the substrate 101 in any direction other than the thickness direction. In FIG. 1, the thickness direction of the substrate 101 is denoted by reference numeral 117, and reference numerals 115, 116 denote horizontal directions that are perpendicular to the thickness direction 117. In the plane of drawing of FIG. 1, the horizontal direction 115 is horizontal, the thickness direction 117 is vertical and the horizontal direction 116 is perpendicular to the plane of drawing of FIG. 1, pointing away from the viewer, as indicated by a circle with a "x" at the center.

The substrate 101 may have a surface that is substantially normal to the thickness direction 117 (horizontal in the plane of drawing of FIG. 1), on which a gate structure 105 of a transistor element 103 and a gate structure 106 of a transistor element 104 are formed. As will be detailed in the following, P-channel field effect transistors may be formed on the basis of the transistor elements 103, 104.

The substrate 101 may be a (100) silicon wafer wherein the thickness direction 117 is approximately parallel to the <100> crystal direction of silicon and the surface on which the gate structures 105, 106 are formed is approximately a (100) crystal plane.

The gate structure 105 may include a gate insulation layer 107, a gate electrode 109 over the gate insulation layer 107, and a capping layer 111 over the gate electrode 109. Adjacent the gate structure 105, a sidewall spacer 113 may be provided. Similarly, the gate structure 106 may include a gate insulation layer 108, a gate electrode 110 and a capping layer 112. Adjacent the gate structure 106, a sidewall spacer 114 may be provided.

In some embodiments, the gate insulation layers 107, 108 may include silicon dioxide and/or silicon nitride, and the gate electrodes 109, 110 may include polysilicon. The capping layers 111, 112 and the sidewall spacers 113, 114 may include silicon dioxide and/or silicon nitride. In some embodiments, the gate insulation layers 107, 108 and/or the gate electrodes 109, 110 may be final gate insulation layers and final gate electrodes, respectively, which remain in the semiconductor structure 100. In other embodiments, the gate insulation layers 107, 108 and/or the gate electrodes 109, 110 may be dummy gate insulation layers and/or dummy gate electrodes, respectively, which are replaced by final gate insulation layers and/or final gate electrodes formed of different materials in later stages of the manufacturing process.

The present disclosure is not limited to embodiments wherein the gate insulation layers 107, 108 include silicon dioxide and/or silicon nitride and the gate electrodes 109, 110 include polysilicon. In other embodiments, the gate insulation layers 107, 108 may include a high-k dielectric material, such as hafnium dioxide, zirconium dioxide, hafnium silicon oxynitride, zirconium silicon oxynitride and/or hafnium zirconium oxide, and the gate electrodes 109, 110 may include one or more metals, optionally in addition to polysilicon.

The semiconductor structure 100 may further include a trench isolation structure 102 which may provide an electrical insulation between the transistor elements 103, 104 and other circuit elements (not shown) in the semiconductor structure 100. As shown in FIG. 1, no portion of the trench isolation structure 102 needs to be provided between the transistor elements 103, 104 so that transistors that are electrically connected in series are formed on the basis of the transistor elements 103, 104. In other embodiments, a portion of the trench isolation structure 102 may be provided between the transistor elements 103, 104 so that transistors that are electrically insulated from each other are formed on the basis of transistor elements 103, 104.

The features of the semiconductor structure 100 shown in FIG. 1 may be formed by means of known techniques for the formation of semiconductor structures. In particular, techniques of photolithography, etching, oxidation, deposition and/or chemical mechanical polishing may be employed for forming the trench isolation structure 102. The gate structures 105, 106 may be formed by depositing a gate stack including layers of the materials of the gate insulation layers 107, 108, the gate electrodes 109, 110 and the capping layers 111, 112 over the substrate 101 and patterning the gate stack by means of techniques of photolithography and etching. The sidewall spacers 113, 114 may be formed by substantially isotropically depositing one or more layers of one or more sidewall spacer materials and anisotropically etching the one or more layers of the one or more sidewall spacer materials.

Figure 2:
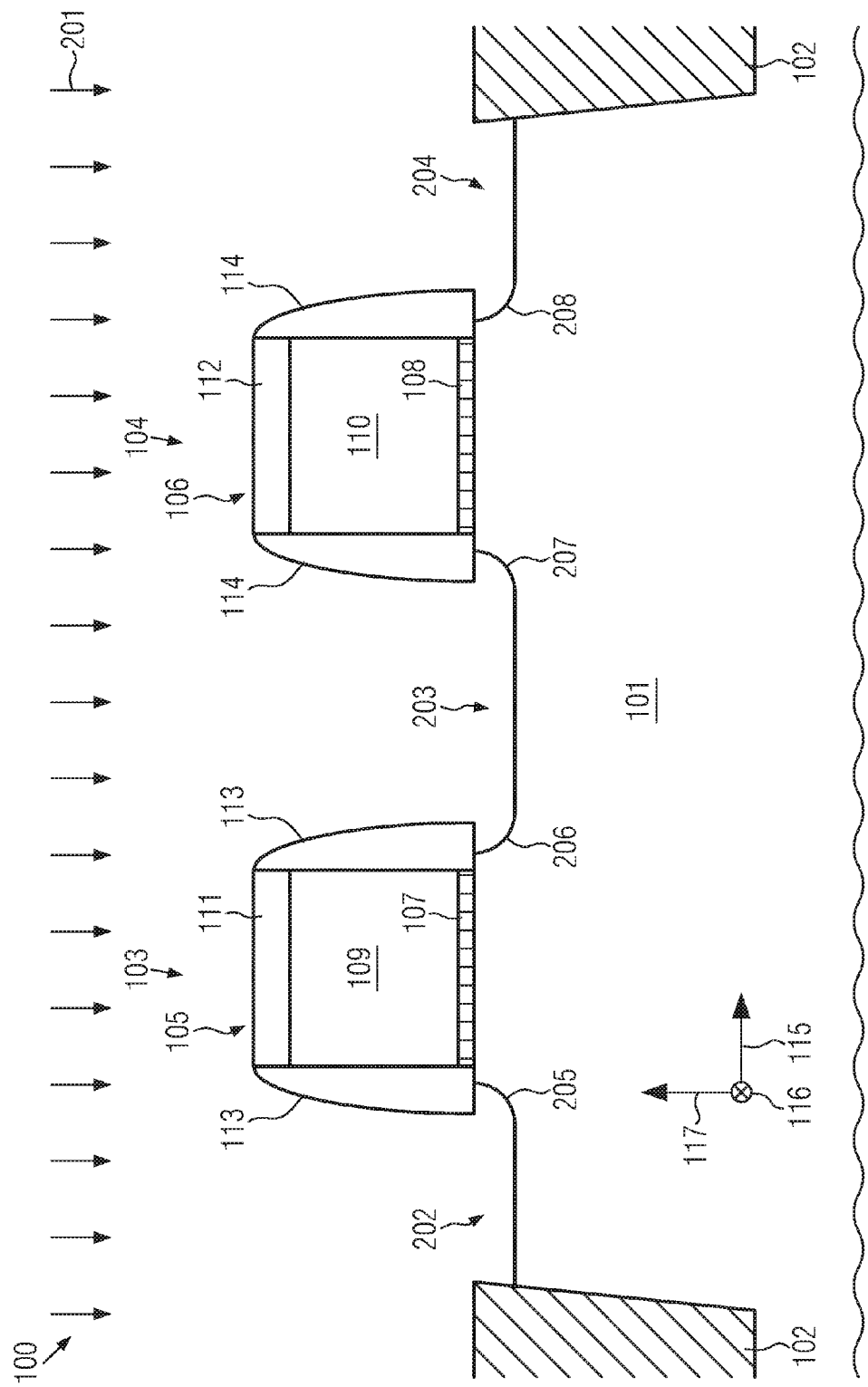

FIG. 2 shows a schematic cross-sectional view of the semiconductor structure 100 in a later stage of the method. After the formation of the gate structures 105, 106, a substantially isotropic first etch process, that is schematically illustrated by arrows 201 in FIG. 2, may be performed. The first etch process 201 may be adapted for selectively removing the semiconductor material of the substrate 101, which may be silicon, relative to the materials of the trench isolation structure 102, the sidewall spacers 113, 114 and the capping layers 111, 112. Thus, a recess 202 may be formed at a source-side of the gate structure 105 (at the left side of the gate structure 105 in the view of FIG. 2), a recess 203 may be formed between the gate structures 105, 106 and a recess 204 may be formed at a drain-side of the gate structure 106 (at the right side of the gate structure 106 in the view of FIG. 2). The recess 203 may provide a common recess at a drain-side of the gate structure 105 (at the right side of the gate structure 105 in the view of FIG. 2) and at a source-side of the gate structure 106 (at the left side of the gate structure 106 in the view of FIG. 2). Thus, a source-side recess and a drain-side recess may be provided for each of the transistor elements 103, 104.

Figure 6:
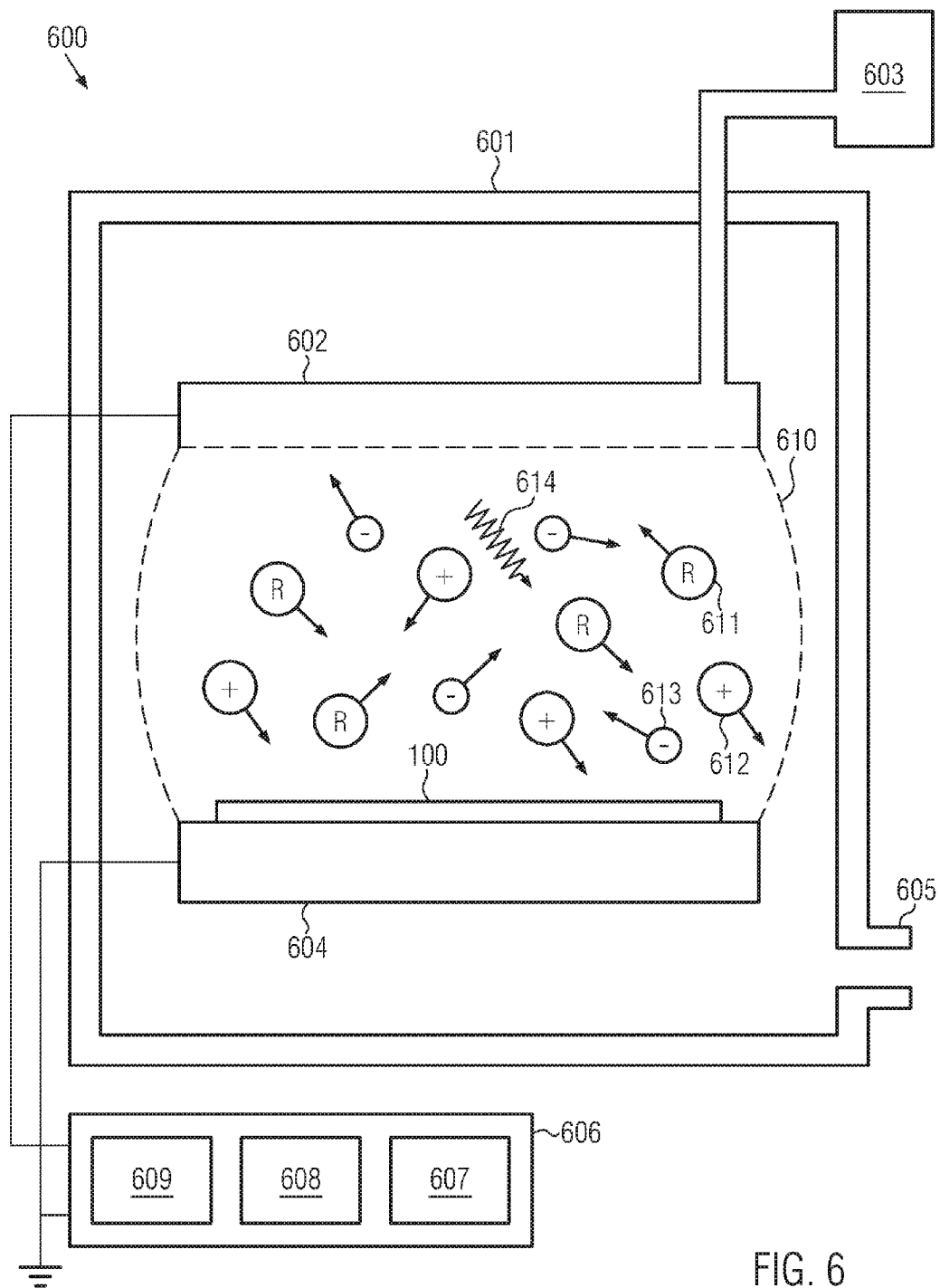
FIG. 6 shows a schematic view of a tool which may be used in a method according to an embodiment.

The first etch process 201 may be a plasma etch process. FIG. 6 shows a schematic view of a tool 600 that may be used for performing the first etch process 201 and a second etch process 301, which will be described in more detail below with reference to FIG. 3.

The tool 600 may include a plasma chamber 601. In the plasma chamber 601, a wafer chuck 604, which may be an electrostatic wafer chuck, may be provided. During the first etch process 201 and the second etch process 301, the semiconductor structure 100 may be provided on the wafer chuck 604, wherein the surface of the substrate 101 over which the gate structures 105, 106 are provided is arranged opposite to the wafer chuck 604. The wafer chuck 604 may provide a bottom electrode that is electrically connected to a power source 606. The tool 600 may further include a showerhead 602, through which an etch gas from a gas supply 603 may be supplied to the plasma chamber 601. The showerhead 602 may provide an upper electrode that is electrically connected to the power source 606. The plasma chamber 601 may further include a gas discharge opening 605, through which the etch gas and gaseous products of etch processes may be removed from the plasma chamber 601, for example by means of a vacuum pump. By supplying etch gas from the gas supply 603 via the showerhead 602 and removing gas from the plasma chamber 601 through the gas discharge opening 605, a substantially constant etch gas pressure may be provided in the plasma chamber 601, and a concentration of reaction products of chemical reactions occurring in the first etch process 201 and the second etch process 301 may be kept relatively low.

The power source 606 may include an AC power source 608 that can apply an alternating voltage in the radio frequency (RF) range, for example an alternating voltage having a frequency of about 2 MHz and/or an alternating voltage in the very high frequency (VHF) range, for example an alternating voltage having a frequency of about 100 MHz, between the showerhead 602 providing the upper electrode and the wafer chuck 604 providing the lower electrode. In some embodiments, the wafer chuck 604 may be grounded. In embodiments, the power source 606 may additionally include a matching box 609 for providing an impedance matching between the electrodes provided by the showerhead 602 and the wafer chuck 604 and the AC power source 608. The power source 606 may further include a DC power source 607 which can apply a bias voltage, which may be a direct voltage, between the showerhead 602 and the wafer chuck 604.

Further features of the tool 600 may correspond to those of known plasma etching tools. For example, in some embodiments, the tool 600 may additionally include measuring instruments, such as an ellipsometer (not shown) and/or a vacuum ultraviolet analytical spectrophotometer (VUVAS) system, which may be used for monitoring the first etch process 201 and the second etch process 301.

By applying an alternating voltage between the showerhead 602 and the wafer chuck 604, a plasma may be formed on the basis of the etch gas supplied to the plasma chamber 601 by the gas supply 603. The plasma 610 may be a relatively weakly ionized plasma, wherein the plasma density may be a relatively small fraction of the neutral gas density. In addition to molecules of the etch gas provided by the gas supply 603, the plasma may include ions (one of them being exemplarily denoted by reference numeral 612 in FIG. 6), electrons (one of them being exemplarily denoted by reference numeral 613) and radicals (one of them being exemplarily denoted by reference numeral 611). Furthermore, the formation of the plasma 610 may create ultraviolet radiation. In FIG. 6, reference numeral 614 exemplarily denotes an ultraviolet photon.

In some embodiments, the etch gas supplied to the plasma chamber 601 by the gas supply 603 may include one or more of chlorine ($Cl_2$), hydrogen bromide (HBr), sulfur hexafluoride ($SF_6$) and tetrafluoromethane ($CF_4$). In particular, using an etch gas including tetrafluoromethane may have some advantages associated therewith. Fluorine, being a radical which may be created from an etch gas including tetrafluoromethane, may etch silicon spontaneously since an activation energy for a chemical reaction between fluorine and silicon is approximately zero. Tetrafluorosilane ($SiF_4$), being the etch product formed in the chemical reaction between silicon and fluorine, is volatile so that it can easily be removed from the plasma chamber 601 by pumping it away through the gas discharge opening 605. Moreover, tetrafluoromethane itself substantially does not chemically react with silicon so that substantially no undesirable byproducts are formed.

In the formation of the plasma 610 on the basis of an etch gas including tetrafluoromethane, the plasma may be sustained through a discharge excitation by means of electron-neutral dissociative ionization:

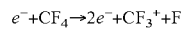
$$e^- + CF_4 \rightarrow 2e^- + CF_3^+ + F$$

Additionally, fluorine, being the reactive radical species, may be created by electron-neutral dissociation:

$$e^- + CF_4 \rightarrow e^- + F + CF_3$$

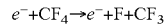
$$e^- + CF_4 \rightarrow e^- + 2F + CF_2$$

The fluorine atoms can then react with silicon from the substrate 101, yielding the volatile etch product tetrafluorosilane:

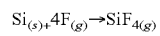
$$Si_{(s)} + 4F_{(g)} \rightarrow SiF_{4(g)}$$

where s and g denote the solid phase and the gas phase, respectively.

During the first etch process 201, no direct voltage or only a very small direct voltage is applied between the electrodes provided by the showerhead 602 and the wafer chuck 604. Thus, etching of the semiconductor material of the substrate 101 may substantially occur due to chemical reactions between radicals 611 in the plasma 610, such as, for example, fluorine, and the semiconductor material of the substrate 101. Therefore, the etching of the semiconductor material of the substrate 101 may be substantially isotropic. Herein, an etch process will be denoted as "isotropic" when the etch rate is approximately the same in any direction, wherein the etch rate in a direction denotes an amount of material per unit area and unit time that is removed from a surface that is normal to the direction. Thus, in isotropic etching, an amount of material that is removed from a surface per unit area and unit time is substantially independent of the orientation of the surface.

Therefore, in the first etch process 201, the etching can proceed both in the thickness direction 117 and in the horizontal directions 115, 116 so that undercuts 205, 206, 207, 208 are formed below the sidewall spacers 113, 114 adjacent the gate structures 103, 104. At the undercuts 205, 206, 207, 208, the recesses 202, 203, 204 extend below the sidewall spacers 113, 114.

Figure 3:
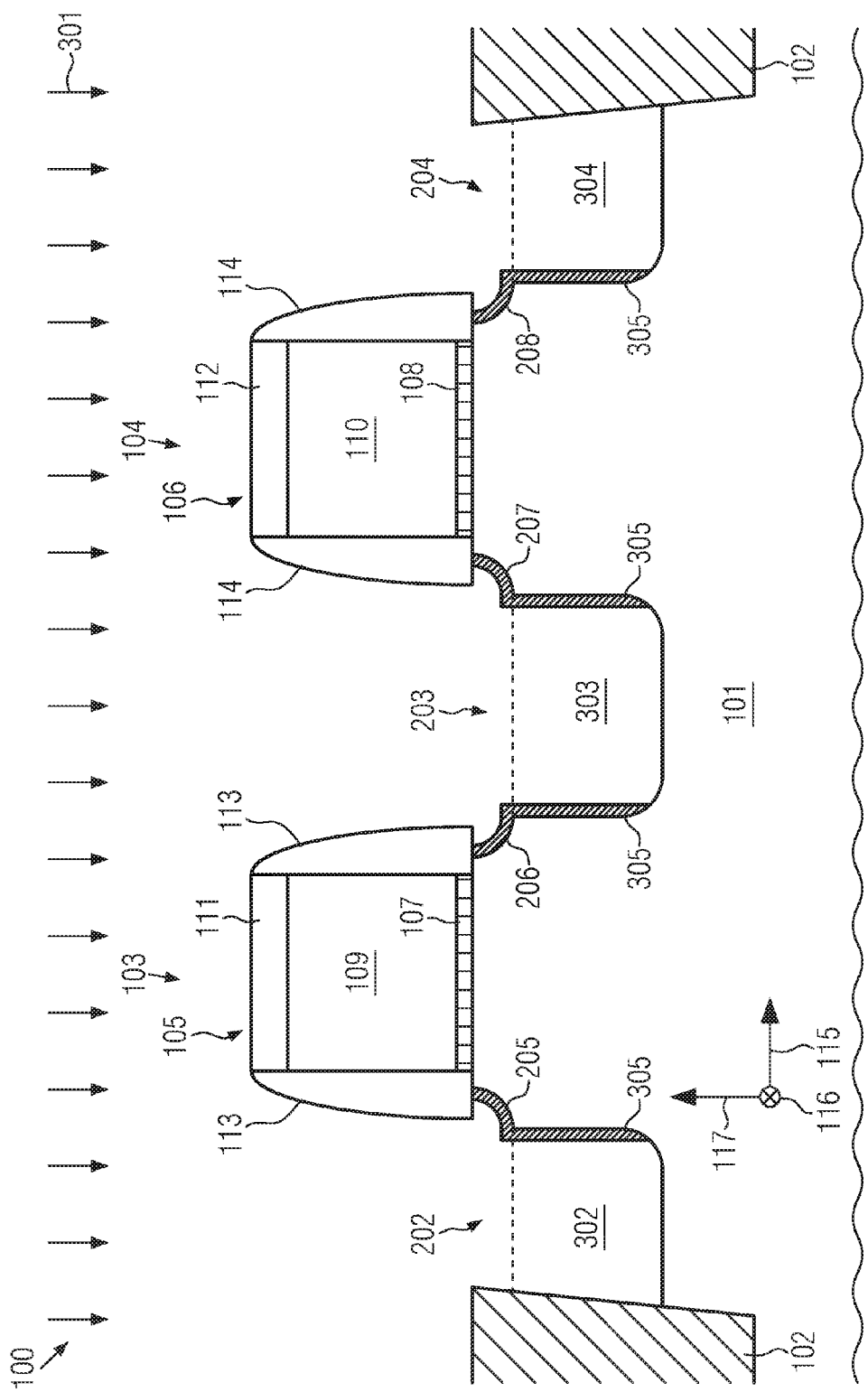

FIG. 3 shows a schematic cross-sectional view of the semiconductor structure 100 at a later stage of the method. After the first etch process 201, a second etch process 301 may be performed. The second etch process 301 may be a plasma etch process which may be performed directly after the first etch process 201 in a same plasma chamber, for example the plasma chamber 601 of the tool 600 described above with reference to FIG. 6, and using substantially the same etch gas composition. However, in the second etch process 301, a direct voltage may be applied by the DC power source 607 between the electrodes provided by the showerhead 602 and the wafer chuck 604. The direct voltage can accelerate ions from the plasma 610 towards the semiconductor structure 100 that is provided on the wafer chuck 604. In embodiments wherein the etch gas that is supplied to the plasma chamber 601 by the gas source 603 includes tetrafluoromethane, the ions can include trifluorocarbon ions ($CF_3^+$). The ions accelerated towards the semiconductor structure 100 can bombard the bottom of the recesses 202, 203, 204, wherein the bombardment by the ions can remove semiconductor material of the substrate 101 therefrom.

Portions of the recesses 202, 203, 204 at the undercuts 205, 206, 207, 208 below the sidewall spacers 113, 114 may be protected from the ion bombardment by the sidewall spacers 113, 114 so that the shape of the undercuts 205, 206, 207, 208 can remain substantially the same during the second etch process 301 or the undercuts 205, 206, 207, 208 can grow to a relatively small extent during the second etch process 301. However, the second etch process 301 can remove the semiconductor material of the substrate 101 from regions 302, 303, 304 adjacent the sidewall spacers 113, 114. Thus, the depth of the recesses 202, 203, 204 may be increased adjacent the sidewall spacers 113, 114.

Since the ions accelerated towards the semiconductor structure 100 can impinge preferentially at the bottom of the recesses 202, 203, 204, the second etch process 301 may be anisotropic. Furthermore, a passivation film 305 may be formed at sidewalls of the recesses 202, 203, 204 and at the undercuts 205, 206, 207, 208, whereas the passivation film 305 may be removed from the bottom of the recesses 202, 203, 204 by the ion bombardment. Moreover, ions impinging on the surface of the semiconductor material of the substrate 101 can eject atoms and molecules so that a physical sputtering of the semiconductor material of the substrate 101 is obtained. This can further increase the anisotropy of the second etch process 301.

In an anisotropic etch process, the etch rate depends on the direction of a normal to a surface that is etched. In the second etch process 301, the etch rate in the thickness direction 117 may be greater than the etch rate in any other direction, such as the horizontal directions 115, 116 so that a greater amount of material is removed from portions of the surface of the semiconductor material of the substrate 101 that are normal to the thickness direction 117 per unit area and unit time than from portions of the surface of the semiconductor material whose normal is inclined relative to the thickness direction 117. In particular, a relatively small etch rate may be obtained at the sidewalls of the recesses 202, 203, 204, where the surface of the semiconductor material of the substrate 101 may be approximately parallel to the thickness direction 117.

Due to the anisotropy of the second etch process 301, the regions 302, 303, 304 from which the semiconductor material of the substrate 101 is removed in the second etch process 301 may have substantially a U-shape, as shown in FIG. 3.

Figure 4:
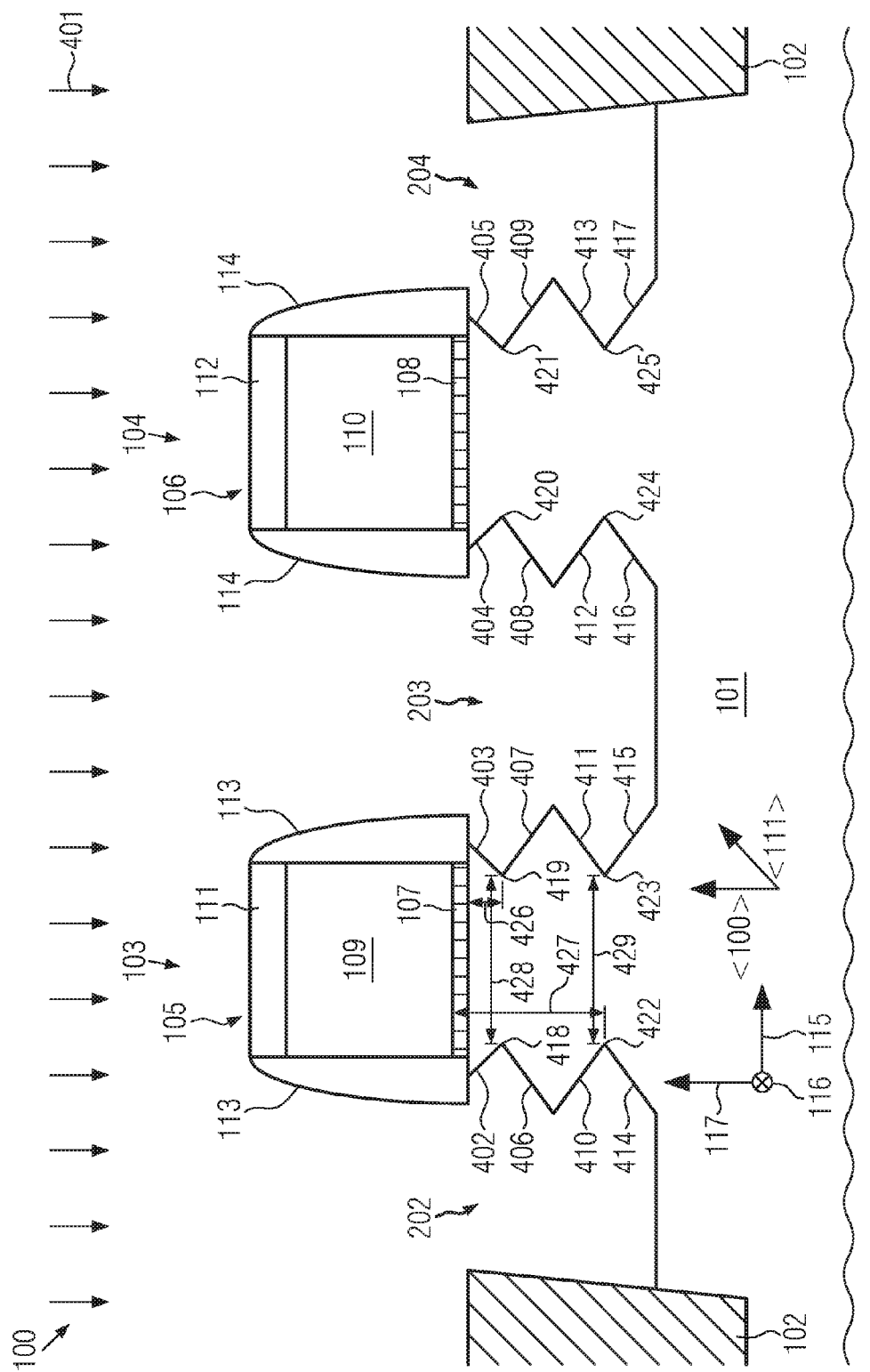

FIG. 4 shows a schematic cross-sectional view of the semiconductor structure 100 at a later stage of the method. After the second etch process 301, a third etch process 401 may be performed. The third etch process 401 may be a crystallographic etch process, for example, a wet etch process wherein an etch solution including tetramethylammonium hydroxide (TMAH) is applied to the semiconductor structure 100, for example by inserting the semiconductor structure 100 into a bath of the etch solution or by spraying etch solution onto the semiconductor structure 100. In some embodiments, a cleaning process may be performed before the third etch process 401 for removing residues of the first etch process 201 and the second etch process 301 such as, for example, the passivation film 305 from the semiconductor structure 100.

In the third etch process 401, an etch rate in a first crystal direction, such as the <100> direction and crystallographically equivalent directions, may be greater than an etch rate in a second crystal direction, for example the <111> direction and crystallographically equivalent directions. In FIG. 4, the <100> direction and the <111> direction are indicated by arrows, wherein the substrate 101 is a (100) wafer wherein the surface on which the gate structures 105, 106 are formed is approximately a (100) crystal plane and the thickness direction 117 is approximately parallel to the <100> direction. The <111> direction may be oblique to each of the thickness direction 117 and the horizontal directions 115, 116.

In the third etch process 401, an amount of material that is removed from surfaces that are normal to the first crystal direction or a crystallographically equivalent direction per unit area and unit time is greater than an amount of material removed from a surface that is normal to the second crystal direction or a crystallographically equivalent direction per unit area and unit time. Thus, in the third etch process 401, surfaces that are approximately perpendicular to the second crystal direction or a crystallographically equivalent direction which have a relatively low etch rate may be formed, in particular at the sidewalls of the recesses 202, 203, 204, wherein the shape of the sidewalls obtained in the third etch process 401 may be influenced by the presence of the undercuts 205, 206, 207, 208 below the sidewall spacers 113, 114 that were formed in the first etch process 201 and by the U-shaped portions of the recesses 202, 203, 204 that were formed in the second etch process 301.

In particular, a sidewall of the recess 202 at the gate structure 105 can obtain a first portion 402 that is inwardly inclined relative to the semiconductor material of the substrate 101 below the gate structure 105, a second portion 406 that is outwardly inclined relative to the semiconductor material of the substrate 101 below the gate structure 105, a third portion 410 that is inwardly inclined relative to the semiconductor material of the substrate 101 below the gate structure 105 and a fourth portion 414 that is outwardly inclined relative to the semiconductor material of the substrate 101 below the gate structure 105. Between the first portion 402 and the second portion 406, a first tip 418 may be provided, and a second tip 422 may be provided between the third portion 410 and the fourth portion 414. Similarly, the sidewall of the recess 203 at the gate structure 105 may have an inwardly inclined first portion 403, an outwardly inclined second portion 407, an inwardly inclined third portion 411 and an outwardly inclined fourth portion 415, wherein the inclination is relative to the semiconductor material of the substrate 101 below the gate structure 105. Between the first portion 403 and the second portion 407, a tip 419 may be provided, and a tip 423 may be provided between the third portion 411 and the fourth portion 415. Similarly, sidewalls of the recesses 203, 204 at the gate structure 106 may have inwardly inclined first portions 404, 405, outwardly inclined second portions 408, 409, inwardly inclined third portions 412, 413 and outwardly inclined fourth portions 416, 417, with first tips 420, 421 between the first and second portions and second tips 424, 425 between the third and fourth portions, the inclination being relative to the semiconductor material of the substrate 101 below the gate structure 106.

The first tips 418, 419, 420, 421 may be provided at a first distance 426 to the gate insulation layer 107, 108 of the respective one of the gate structures 105, 106 below which they are provided, and first tips 418, 419, 420, 421 below the same gate structure may be provided at a first tip-to-tip distance 428.

Similarly, the second tips 422, 423, 424, 425 may be provided at a second distance 427 to the gate insulation layer 107, 108 of the respective one of the gate structures 105, 106 below which they are provided and at a second tip-to-tip distance 429 between second tips below the same gate structure. The first distance 426 may be smaller than the second distance 427. In particular, the first distance 426 of the first tips 418, 419, 420, 421 to the gate insulation layer may be substantially smaller than the distance of tips of known sigma-shaped recesses to gate insulation layers of gate structures at which the recesses are formed. This may help to increase a stress provided at the channel of the transistors formed from the transistor elements 103, 104 when the recesses 202, 203, 204 are filled with a semiconductor material having a different lattice constant than the semiconductor material of the substrate 101, as described below with reference to FIG. 5.

In some embodiments, the first distance 426 of the first tips 418, 419, 420, 421 from the gate insulation layers 107, 108 may in a range from about 3-20 nm. The distance 427 of the second tips 422, 423, 424, 425 from the gate insulation layers 107, 108 may be in a range from about 15-35 nm. The first tip-to-tip distance 428 between the first tips 418, 419, 420, 421 may be in a range from about 15-60 nm, and the second tip-to-tip distance 429 between the second tips 422, 423, 424, 425 may be in a range from about 15-60 nm.

Figure 5:
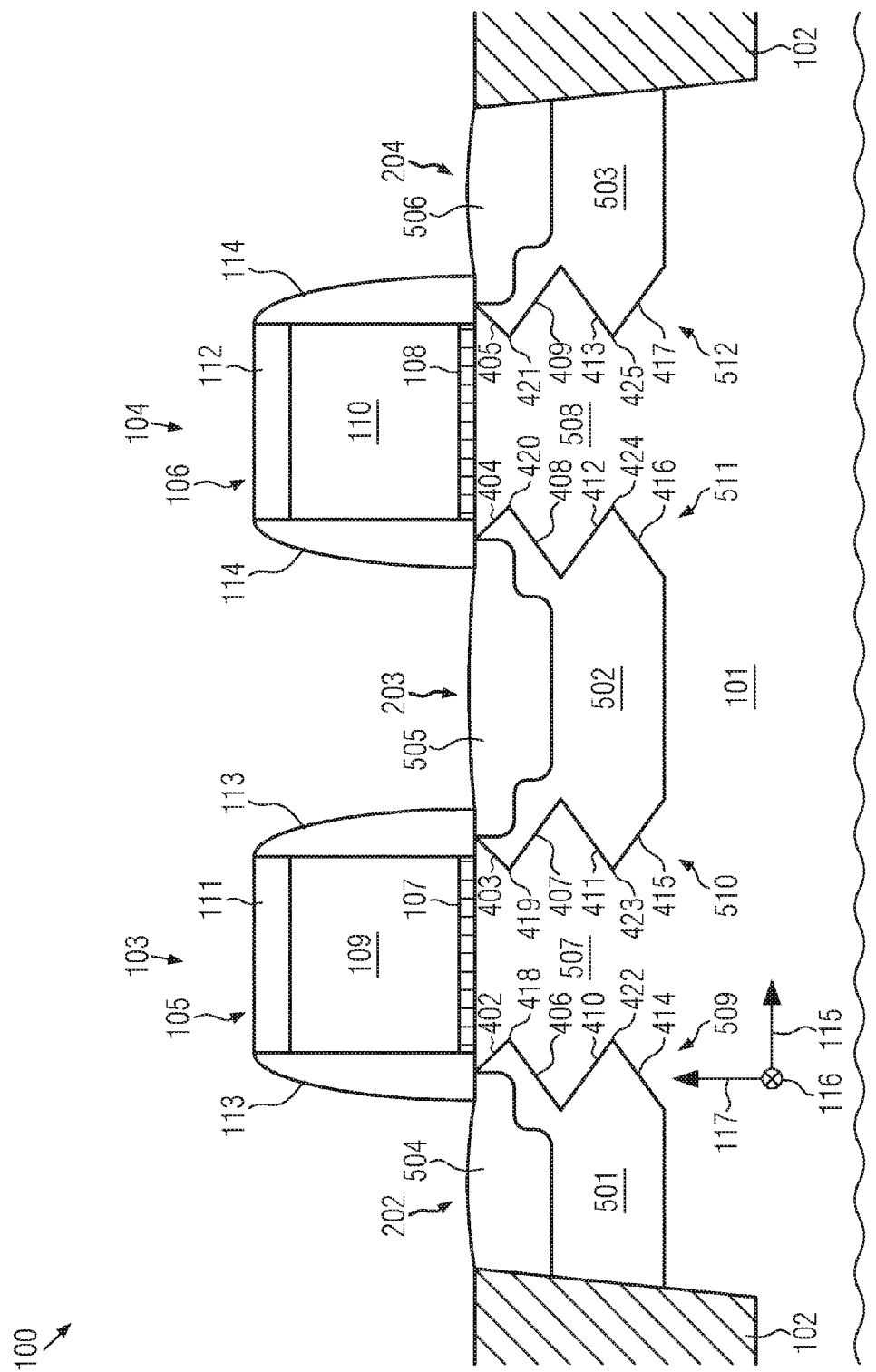

FIG. 5 shows a schematic cross-sectional view of the semiconductor structure 100 at a later stage of the method. After the third etch process 401, the recesses 202, 203, 204 may be filled with a semiconductor material having a different lattice constant than the semiconductor material of the substrate 101. In embodiments wherein the substrate 101 includes silicon and wherein P-channel transistors are to be formed on the basis of the transistor elements 103, 104, the recesses 202, 203, 204 may be filled with silicon germanium, which has a greater lattice constant than silicon. Thus, a compressive stress may be obtained. The silicon germanium in the recess 202 may provide a stress creating region 501 at the source-side of the gate structure 105, the silicon germanium in the recess 203 may provide a stress creating region 502 at the drain-side of the gate structure 105 and the source-side of the gate structure 106, and the silicon germanium in the recess 204 may provide a stress creating region 503 at the drain-side of the gate structure 106. Thus, in each of the transistor elements 103, 104, a source-side stress creating region and a drain-side stress creating region may be provided.

For filling the recesses 202, 203, 204 with the semiconductor material having a different lattice constant than the semiconductor material of the substrate 101, a selective epitaxial growth process may be employed, for example, a selective epitaxial growth process adapted for the deposition of silicon germanium.

After the formation of the stress creating regions 501, 502, 503, one or more ion implantation processes may be performed for forming a source region 504 at the source-side of the gate structure 105, a source/drain region 505 between the gate structures 105, 106, which provides a drain region of the transistor element 103 and a source region of the transistor element 104, and a drain region 506 at the drain-side of the gate structure 106. The source region 504, the source/drain region 505 and the drain region 506 may be P-doped, which may be obtained by implanting ions of a P-type dopant, such as boron, into the semiconductor structure. Portions of the semiconductor material of the substrate 101 between the stress creating regions 501, 502 may provide a channel region 507 of the transistor element 103, and portions of the semiconductor material of the substrate 101 between the stress creating regions 502, 503 may provide a channel region 508 of the transistor element 104, wherein the channel regions 507, 508 may be doped differently than the source region 504, the source/drain region 505 and the drain region 506, for example, N-doped or substantially undoped.

The source region 504 may be provided in the stress creating region 501, the source/drain region 505 may be provided in the stress creating region 502 and the drain region 506 may be provided in the stress creating region 503.

The sidewall surface of the recess 202 at the gate structure 105 may provide an interface 509 between the stress creating region 501 and the channel region 507, wherein the interface 509 has inwardly inclined portions 402, 410, outwardly inclined portions 406, 414 and tips 418, 420. Similarly, the sidewall of the recess 203 at the gate structure 105 may provide an interface 510 between the stress creating region 502 and the channel region 507 having inwardly inclined portions 403, 411, outwardly inclined portions 407, 415 and tips 419, 423. At the transistor element 104, an interface 511 between the stress creating region 502 and the channel region 508 and an interface between the stress creating region 503 and the channel region 508 may be provided, having features similar to those of the interfaces between the stress creating regions 501, 502 and the channel region 507 at the gate structure 105.

In some embodiments, after the formation of the stress creating regions 501, 502, 503, the sidewall spacers 113, 114 may be removed, and one or more other sidewall spacers may be formed, wherein the one or more of the ion implantation processes that are performed for forming the source regions 504, 505, 506 are performed after the formation of some or all of the one or more new sidewall spacers so that a desired dopant profile may be obtained adjacent the channel regions 507, 508.

After the formation of the source region 504, the source/drain region 505 and the drain region 506, each of the transistor elements 103, 104 may provide a P-channel field effect transistor.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. A method, comprising:
  providing a semiconductor structure, comprising:
    a substrate comprising a first semiconductor material and having a planar upper surface;
    a gate structure formed over said substrate; and
    a sidewall spacer formed adjacent said gate structure, wherein a first upper surface portion of said planar upper surface is covered by said gate structure and said sidewall spacer, and wherein a second upper surface portion of said planar upper surface is exposed;

performing a substantially isotropic first etch process on said exposed second upper surface portion to remove a first portion of said first semiconductor material, wherein an undercut is formed below said sidewall spacer during said first etch process;

after performing said first etch process, performing an anisotropic second etch process to remove a second portion of said first semiconductor material, wherein, during said second etch process, an etch rate of said first semiconductor material in a thickness direction of said substrate is greater than an etch rate of said first semiconductor material in a horizontal direction of said substrate that is perpendicular to said thickness direction; and performing a crystallographic third etch process to remove a third portion of said first semiconductor material, wherein, during said third etch process, an etch rate of said first semiconductor material in a first crystal direction is greater than an etch rate of said first semiconductor material in a second crystal direction;

wherein said first, second and third etch processes form a source-side recess and a drain-side recess adjacent said gate structure.

2. The method of claim 1, further comprising filling said source-side recess and said drain-side recess with a second semiconductor material having a different lattice constant than said first semiconductor material, wherein a source-side stress creating region and a drain-side stress creating region are formed.

3. The method of claim 1, wherein each of said first etch process and said second etch process comprises a dry etch process and said third etch process comprises a wet etch process.

4. The method of claim 1, wherein performing each of said first etch process and said second etch process comprises creating an electric discharge in an etch gas wherein a plasma is formed and exposing said semiconductor structure to said plasma;

wherein said second etch process further comprises applying a bias voltage to said plasma, wherein said bias voltage accelerates ions in said plasma towards said semiconductor structure; and wherein substantially no bias voltage is applied to said plasma during said first etch process.

5. The method of claim 4, wherein said first etch process and said second etch process are performed in a same plasma chamber.

6. The method of claim 5, wherein said second etch process is performed directly after said first etch process, and wherein a composition of said etch gas in said first etch process and said second etch process is substantially the same.

7. The method of claim 1, wherein said third etch process comprises applying an aqueous solution of tetramethylammoniumhydroxide to said semiconductor structure.

8. The method of claim 2, wherein said first semiconductor material comprises silicon and said second semiconductor material comprises silicon germanium.

9. The method of claim 8, further comprising, after filling said source-side recess and said drain-side recess with said second semiconductor material, forming a P-doped source region and a P-doped drain region adjacent said gate structure, wherein at least a portion of said source region is provided in said source-side stress creating region and at least a portion of said drain region is provided in said drain-side stress creating region, a portion of said first semiconductor material below said gate structure providing a channel region.

10. The method of claim 9, wherein each of an interface between said source-side stress creating region and said channel region and an interface between said drain-side stress creating region and said channel region comprises:

a first portion that is inclined inwardly with respect to said channel region, a second portion below said first portion that is inclined outwardly with respect to said channel region, a third portion below said second portion that is inclined inwardly with respect to said channel region and a fourth portion below said third portion that is inclined outwardly with respect to said channel region.

11. The method of claim 10, wherein said second etch process removes said first semiconductor material from a source-side region and a drain-side region adjacent said gate structure, each of said source-side region and said drain-side region having a substantially U-shaped cross-section.

12. The method of claim 11, wherein said etch gas comprises at least one of chlorine ($Cl_2$), hydrogen bromide (HBr), sulfur hexafluoride ($SF_6$) and tetrafluoromethane ($CF_4$).

13. The method of claim 12, wherein said substrate comprises a silicon wafer and said thickness direction of said substrate is substantially parallel to a <100> crystal direction of silicon.

14. The method of claim 1, wherein performing said second etch process comprises forming a passivation layer at least on exposed surfaces of said undercut.

15. The method of claim 1, wherein, during said first etch process, an etch rate of said first semiconductor material in said thickness direction of said substrate is substantially the same as an etch rate of said first semiconductor material in said horizontal direction of said substrate.

16. A method, comprising:
forming a gate structure over a planar upper surface of a semiconductor substrate, said semiconductor substrate comprising a semiconductor material;

forming a sidewall spacer adjacent to sidewalls of said gate structure, wherein a first upper surface portion of said planar upper surface is covered by said gate structure and said sidewall spacer, and wherein a second upper surface portion of said planar upper surface is exposed;

performing a substantially isotropic etch process on said exposed second upper surface portion of said planar upper surface to remove a first portion of said semiconductor material and thereby form a first portion of a recess in said semiconductor substrate adjacent to said gate structure, wherein said first portion of said recess comprises an undercut portion that extends below said sidewall spacer;

performing an anisotropic etch process on said first portion of said recess to remove a second portion of said semiconductor material and thereby form a second portion of said recess in said semiconductor substrate that extends below said first portion of said recess; and performing a crystallographic etch process on said first and second portions of said recess to remove a third portion of said semiconductor material and thereby form a final sigma-shaped recess in said semiconductor substrate adjacent to said gate structure.

17. The method of claim 16, wherein said semiconductor material is a first semiconductor material, the method further comprising filling said final sigma-shaped recess with a second semiconductor material having a different lattice constant than said first semiconductor material.

18. The method of claim 17, wherein said first semiconductor comprises silicon and said second semiconductor material comprises silicon germanium.

19. The method of claim 16, wherein sidewalls of said final sigma-shaped recess comprise a first portion that is inclined inwardly with respect to a channel region formed below said gate structure, a second portion below said first portion that is inclined outwardly with respect to said channel region, a third portion below said second portion that is inclined inwardly with respect to said channel region, and a fourth portion below said third portion that is inclined outwardly with respect to said channel region.

20. A method, comprising:
  forming a gate structure over a planar upper surface of a semiconductor substrate, wherein a first upper surface portion of said planar upper surface is covered by said gate structure, said semiconductor substrate comprising a semiconductor material;
  forming a sidewall spacer adjacent to sidewalls of said gate structure, wherein a second upper surface portion of said planar upper surface is covered by said sidewall spacer, and wherein a third upper surface portion of said planar upper surface laterally adjacent to said sidewall spacer is exposed; and
  forming a sigma-shaped recess in said semiconductor substrate adjacent to said gate structure, wherein forming said sigma-shaped recess comprises:
    forming a first recess by performing a substantially isotropic etch process on said exposed third upper surface portion of said planar upper surface to remove a first portion of said semiconductor material from said semiconductor substrate, said first recess comprising an undercut portion extending below said sidewall spacer;
    forming a second recess in said semiconductor substrate that extends below said first recess by performing an anisotropic etch process on said first recess to remove a second portion of said semiconductor material from said semiconductor substrate; and
    performing a crystallographic etch process on said first and second recesses to remove a third portion of said semiconductor material from said semiconductor substrate.

* * * * *